(12) United States Patent
van Kempen et al.

(10) Patent No.: US 6,818,115 B2
(45) Date of Patent: Nov. 16, 2004

(54) SYSTEM AND METHOD FOR ELECTROLYTIC PLATING

(75) Inventors: Hein van Kempen, Roggel (NL); Daniel J. Weber, St. Louis, MO (US)

(73) Assignee: Viasystems Group, Inc., St. Louis, MO (US)

( * ) Notice: Subject to any disclaimer, the term of this patent is extended or adjusted under 35 U.S.C. 154(b) by 0 days.

(21) Appl. No.: 10/273,820

(22) Filed: Oct. 18, 2002

(65) Prior Publication Data

US 2003/0196904 A1 Oct. 23, 2003

Related U.S. Application Data

(60) Provisional application No. 60/344,417, filed on Oct. 19, 2001.

(51) Int. Cl.[7] .............................................. C25D 5/00
(52) U.S. Cl. ..................... 205/96; 205/133; 205/148; 205/125; 205/131; 204/224 R; 204/198
(58) Field of Search ........................ 205/96, 133, 148, 205/125, 131; 204/224 R, 198

(56) References Cited

U.S. PATENT DOCUMENTS 4,696,729 A * 9/1987 Santini ................... 204/224 R 2001/0045360 A1 * 11/2001 Omasa ....................... 205/108
2003/0010625 A1 * 1/2003 Gramarossa et al. ........ 204/198

* cited by examiner

Primary Examiner—Wesley A. Nicolas
(74) Attorney, Agent, or Firm—Dunlap, Codding & Rogers, P.C.

(57) ABSTRACT

The present invention includes an electrolytic plating system with an elecrolytic plating bath, means for positioning the printed circuit boards in the bath, and means to alternately generate a laminar flow of electrolyte on each side of the printed circuit boards. A preferred means to alternately generate a laminar flow of electolyte comprises a floating shield with a venturi-shaped partition and an aligned partition below the printed circuit boards, and operating a plurality of eductors below the floating shield. The means to alternately generate a laminar flow of electrolyte can further comprise a transport mechanism that moves the floating shield and its partitions from side to side relative to the eductors or a mechanism to move the eductors. The plating can be also be improved by using a vibrator and a spring-mounting system that prevents vibration energy being absorbed by fixed portions of the plating system.

18 Claims, 3 Drawing Sheets

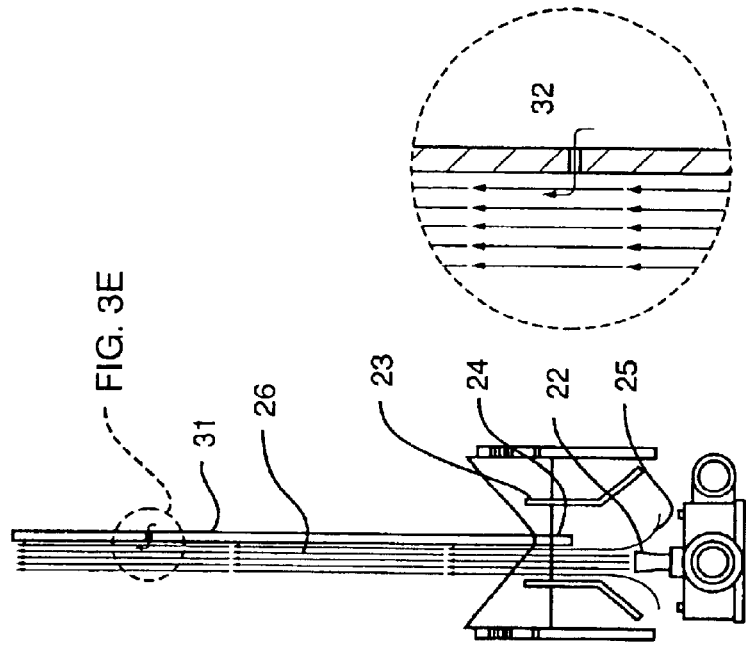
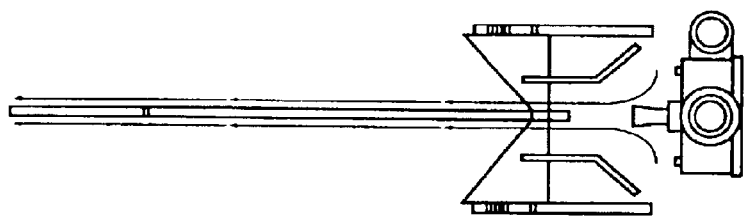
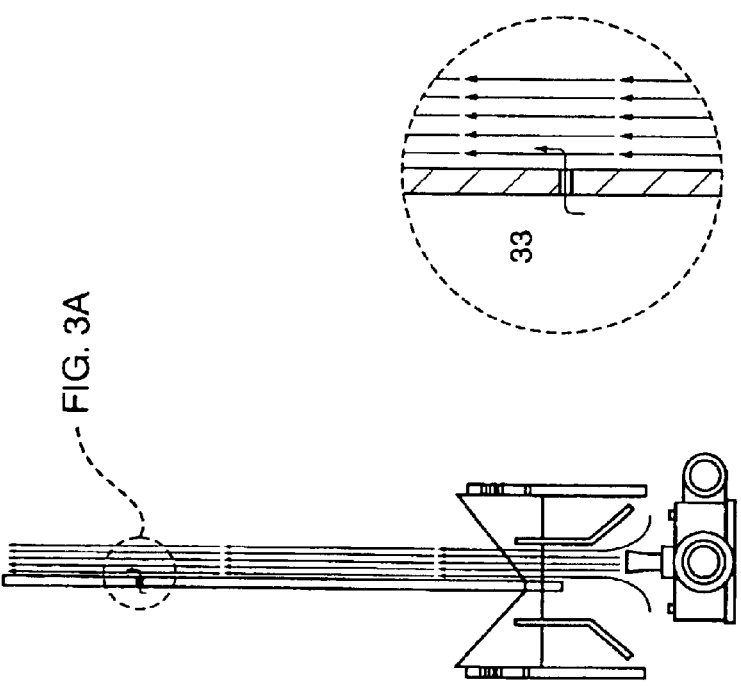

SYSTEM AND METHOD FOR ELECTROLYTIC PLATING

RELATIONSHIP TO OTHER APPLICATIONS

This application claims priority to U.S. Provisional Application Ser. No. 60/344,417, filed Oct. 19, 2001, which is hereby incorporated by reference in its entirety.

BACKGROUND OF THE INVENTION

For the printed circuit boards of existing and future high technology products, the problems of plating voids and poor plating distribution are becoming increasingly difficult due to the increase in aspect ratio. Printed circuit boards keep getting thicker and holes keep getting smaller. When a plating void is detected in a printed circuit board, the board is rejected because of an open circuit.

Additionally, poor plating distribution can cause "dog-bone" effects or, even worse, rejection of the board because of the fact that the minimum required thickness cannot be achieved inside of the (micro) via holes.

The present electrolytic plating invention seeks to overcome or minimize these kinds of problems.

BRIEF SUMMARY OF THE INVENTION

The present invention provides an electrolytic plating system in which the vibrator is mounted on a free, movable part of the flight bar. The vibrator is not mounted on one of the massive (rigid) parts of the line. In prior art systems, a significant loss of vibration energy occurs through absorption by the massive parts on which the vibrator is mounted. The mounting of the present invention allows all of the energy to be carried forward to the printed circuit boards in the plating line. Additionally, the energy transfer is more even compared to prior art systems.

The manner in which the vibration energy is carried to the product is more efficient and results in a dramatic reduction in plating voids.

The present invention also provides improved flow of the electrolyte through the holes of the printed circuit boards, which generates an improved throwing power of plating inside of the through holes and blind vias. The improved flow is accomplished by an increase in laminar flow along the printed circuit boards.

The laminar flow along the printed circuit boards is increased on one side of the panel and generates an underpressure in the through hole. Because of this underpressure, electrolyte is drawn from the other side of the panel through the hole to generate a better plating distribution. By bath movement, the laminar flow is moved from one side of the panel to the other side. Accordingly, the underpressure is also moved from one side to the other side and the eletrolyte is then drawn through the hole in the opposite direction.

The increased flow is generated first by an eductor system that is placed under specially designed floating shields. The resulting eductor system works like a venturi, so the volume of electrolyte that is pumped through the eductor is increased 5 times when leaving the eductor. Second, the floating shield itself also creates a venturi flow because of it special design. The electrolyte exiting this floating shield has much higher and better laminar flow as compared to standard plating designs.

BRIEF DESCRIPTION OF THE DRAWINGS

FIGS. 3A–B, 3C, and 3D–E illustrate the laminar flow patterns of the present invention.

DETAILED DESCRIPTION OF THE INVENTION

Figure 1:
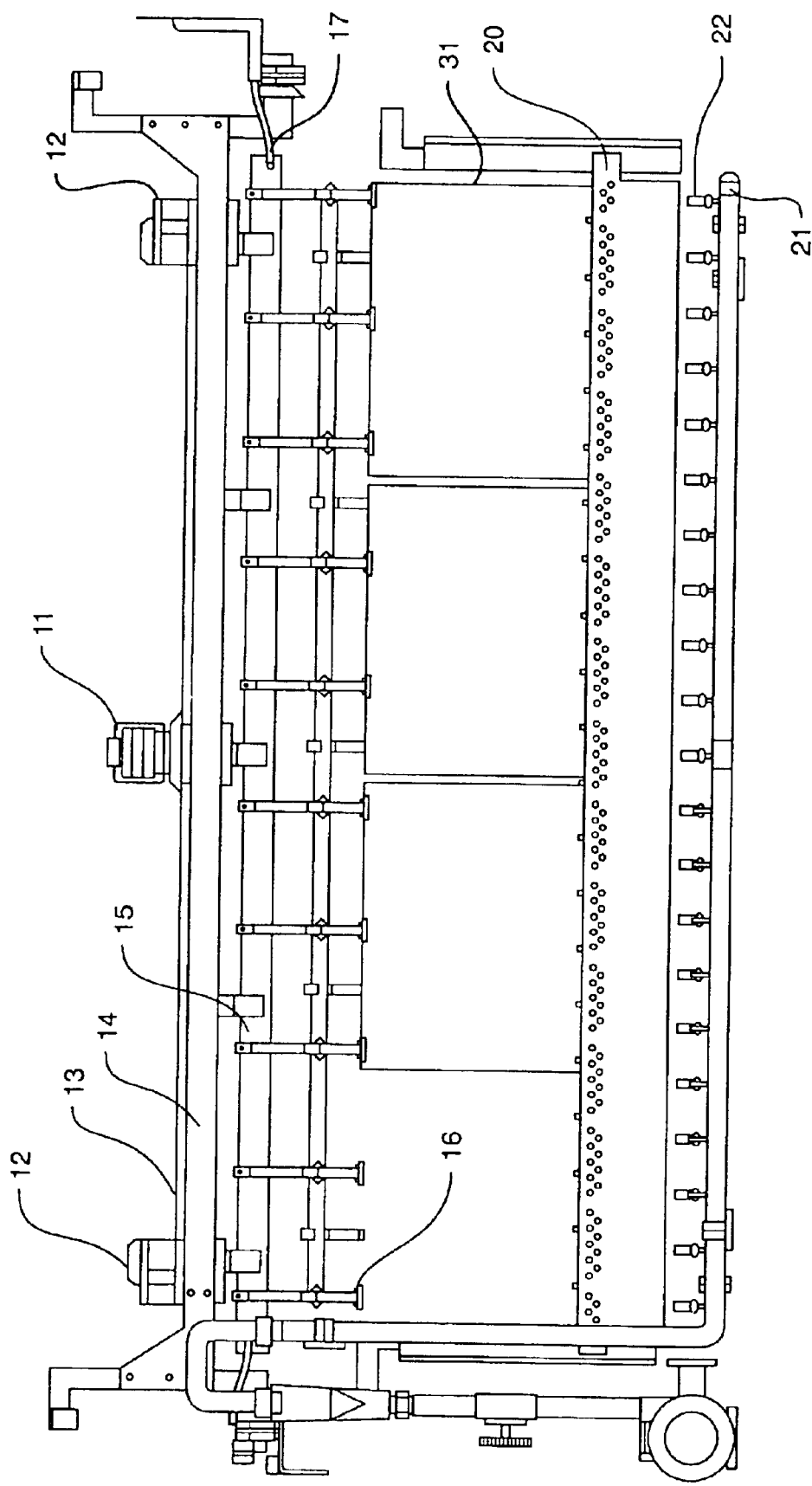
FIG. 1 illustrates the electrolytic plating apparatus.

As illustrated in FIG. 1, the electrolytic plating apparatus includes a vibrator 11 attached to upper rod 13. The upper rod 13 is mounted with a spring system 12 to the rigid rod 14 that is used to support the v-saddles of the production line. The spring system 12 prevents vibration energy from being absorbed by the rigid parts of the apparatus.

The upper rod 13 carries the vibration energy from vibrator 11 and produces homogeneous vibration energy to carry to lower rod 15. Clamps 16, in which the printed circuit boards are fixed, are connected to lower rod 15, as is flexible current-supply connection 17.

Figure 2B:
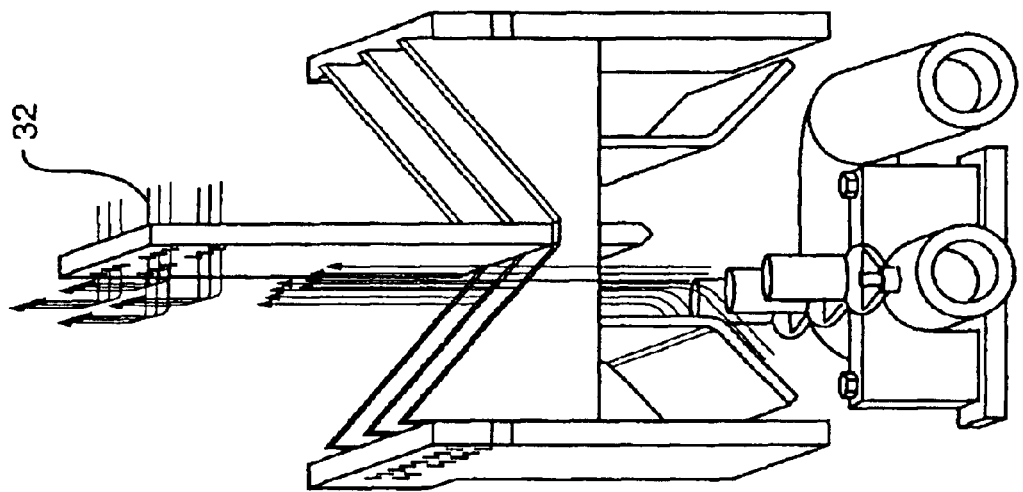
FIGS. 2A and 2B illustrate partial end-views of the production line.
Figure 2A:
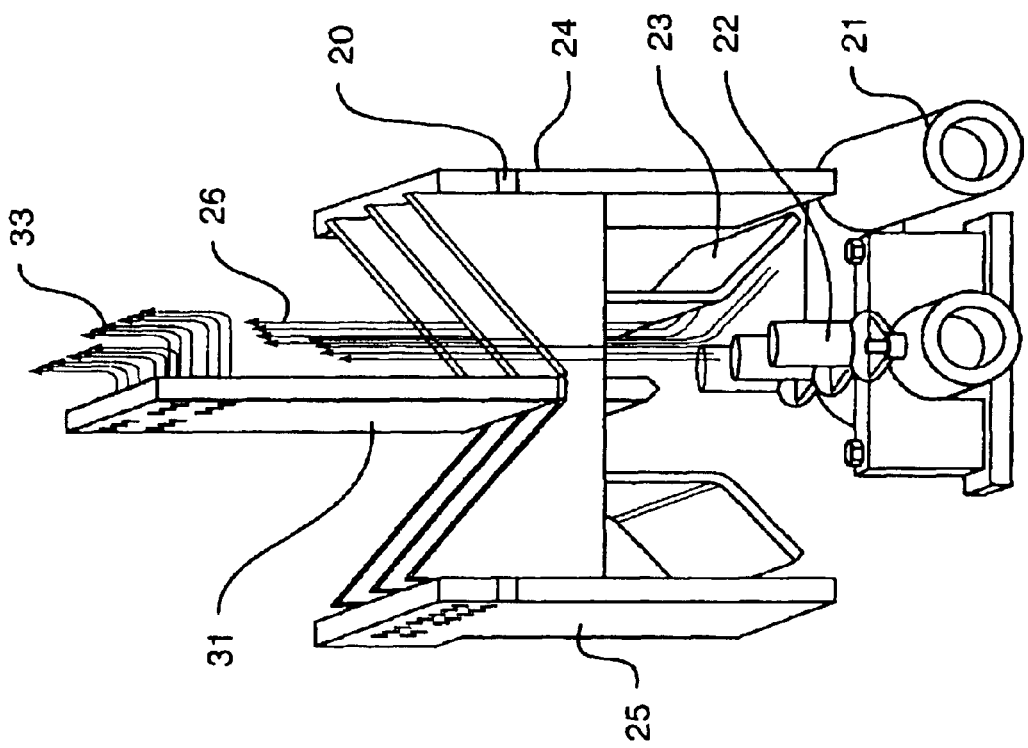

As illustrated in FIGS. 1 and 2A–B, the system includes a special floating shield 20 in which the venturi flow effect is increased. Electrolyte is supplied through piping 21 to eductors 22 so as to draw additional electrolyte from the bath.

As illustrated in FIGS. 2A–B and 3A–E, partitions 23 of floating shield 20 are shaped to enhance the venturi effect 25 of the eductors 22. Partition 24 is located directly below the printed circuit boards and acts to direct the flow to either side of the boards, depending on the location of the shield 20. The partitions 23 also assist in producing the improved laminar flow 26 along the printed circuit boards 31.

The laminar flow 26 causes the formation of a low pressure region (i.e., Bernoulli effect) to draw an increased flow 33 of electrolyte through the through holes of the printed circuit boards 31, as illustrated in FIG. 2A. As shown in FIG. 2B, when the floating shield 20 is moved relative to the eductors 22 by the transport movement, the laminar flow is directed to and increased on the opposite side of the printed circuit board by partitions 23 and 24 so as to cause the flow 32 of electrolyte in the opposite direction through the through hole.

FIGS. 3A–E show the transition of the laminar flow and through hole flow from the having the transport mechanism move the shield and its partitions from the left (FIGS. 3A–B) of the eductors 22, to the middle (FIG. 3C), and then to the right (FIGS. 3D–E) of the eductors 22.

Although described with reference to a particular embodiment, one of skill in the art would understand that various modifications can be made within the scope of the present invention. The present invention includes any electrolytic plating system with an elecrolytic plating bath, means for positioning the printed circuit boards in the bath, and means to alternately generate a laminar flow of electrolyte on each side of the printed circuit boards. A preferred means to alternately generate a laminar flow of electrolyte comprises a floating shield with a venturi-shaped partition and an aligned partition below the printed circuit boards, and plurality of eductors below the floating shield. The means to alternately generate a laminar flow of electrolyte can further comprise a transport mechanism that moves the floating shield and its partitions from side to side relative to the eductors or a mechanism to move the eductors.

The plating can be further improved by using a vibrator and a spring-mounting system that prevents vibration energy being absorbed by fixed portions of the plating system.

An exemplary embodiment of the invention is an electrolytic plating system for plating vias and thru-holes in printed circuit boards that includes an electrolyte bath, a lower rod above the bath, a flexible electrical current supply connection attached to the lower rod, at least one printed circuit board clamp attached to the lower rod, a floating shield with v-saddles in contact with the printed circuit boards, the floating shield further comprising a venturi-shaped partition, at least one eductor in a lower portion of the bath below the floating shield for producing a laminar flow of electrolyte across the printed circuit boards, and means to alternate the laminar flow from one side of the printed circuit board to an other side of the printed circuit board. This system could also further comprise an upper rod that supports the lower rod, a vibrator on the upper rod, and a spring system to mount the upper rod to a rigid structure. The floating shield could further comprise a partition directly below the printed circuit boards to direct flow of electrolyte to either side of the printed circuit boards and the means to alternate the laminar flow can be provided by a transport mechanism that moves the shield and its partitions from side to side relative to the eductors.

The invention can also be limited to the improvement in vibration energy, such as an electrolytic plating system for printed circuit boards comprising a plating line supporting the printed circuit boards with a lower support rod, an upper rod that supports the lower rod, a vibrator on the upper rod, and a spring system to mount the upper rod to a rigid structure.

Methods of practicing the present invention include an electrolytic plating method for plating vias and thru-holes in printed circuit boards that comprises positioning the printed circuit boards in an electrolytic bath and alternately generating a laminar flow of electrolyte on each side of the printed circuit boards. Alternately generating a laminar flow of electolyte can be provided by positioning a floating shield with a venturi-shaped partition and an aligned partition below the printed circuit boards; and operating a plurality of eductors below the floating shield, and can further comprise moving a transport mechanism so as to move the floating shield and its partitions from side to side relative to the eductors. The method can further include supplying vibration energy to the printed circuit boards in the bath by mounting a vibrator on the transport mechanism using a spring-mounting system to prevent vibration energy being absorbed by fixed supports.

Another electrolytic plating method for plating vias and thru-holes in printed circuit boards includes providing an electrolyte bath, positioning a lower rod above the bath, providing electrical current to the lower rod with a flexible connection, clamping at least one printed circuit board to the lower rod, transporting the printed circuit boards in a floating shield with v-saddles in contact with the printed circuit boards, the floating shield further positioning a venturi-shaped partition below the printed circuit boards, producing a laminar flow of electrolyte across the printed circuit boards with at least one eductor positioned in a lower portion of the bath below the floating shield, and alternating the laminar flow from one side of the printed circuit board to an other side of the printed circuit board. This method can further comprise supporting the lower rod with an upper rod, supplying vibration energy to the upper rod; and isolating the vibration energy from a fixed structure with a spring system, as well as providing a partition directly below the printed circuit boards to direct flow of electrolyte to either side of the printed circuit boards. Again, moving a transport mechanism that moves the shield and its partitions from side to side relative to the eductors can be used to alternate the laminar flow.

Another electrolytic plating method for printed circuit boards of the present invention comprises supporting the printed circuit boards with a lower support rod of a plating line, supporting the lower rod with an upper rod, supplying vibration energy to the upper rod, and mounting the upper rod to a rigid structure with a spring system.

It will be appreciated that various modifications and improvements may be made to the described embodiments without departing from the scope of the invention, which is limited only by the claims, below.

I claim:

1. An electrolytic plating system for plating vias and thru-holes in printed circuit boards, comprising:

an electrolytic plating bath;

means for positioning said printed circuit boards in said bath; and means to alternately generate a laminar flow of electrolyte on each side of said printed circuit boards.

2. The electrolytic plating system of claim 1, wherein said means to alternately generate a laminar flow of electrolyte further comprises a floating shield with a venturi-shaped partition and an aligned partition below said printed circuit boards and plurality of eductors below said floating shield.

3. The electrolytic plating system of claim 2, wherein said means to alternately generate a laminar flow of electrolyte further comprises a transport mechanism that moves the floating shield and its partitions from side to side relative to said eductors.

4. The electrolytic plating system of claim 1, wherein said means for positioning said printed circuit boards in said bath further comprises a vibrator and a spring-mounting system to prevent vibration energy being absorbed by fixed portions of said system.

5. An electrolytic plating system for plating vias and thru-holes in printed circuit boards, comprising:

an electrolyte bath;

a lower rod above said bath;

a flexible electrical current supply connection attached to said lower rod;

at least one printed circuit board clamp attached to said lower rod;

a floating shield with v-saddles in contact with said printed circuit boards, said floating shield further comprising a ventui-shaped partition;

at least one eductor in a lower portion of said bath below said floating shield for producing a laminar flow of electrolyte across said printed circuit boards; and means to alternate said laminar flow from one side of said printed circuit board to an other side of said printed circuit board.

6. The electrolytic plating system of claim 5, further comprising:

an upper rod that supports said lower rod;

a vibrator on said upper rod; and a spring system to mount said upper rod to a rigid structure.

7. The electrolytic plating system of claim 5, wherein said floating shield further comprises a partition directly below said printed circuit boards to direct flow of electrolyte to either side of said printed circuit boards.

8. The electrolytic plating system of claim 7, wherein said means to alternate said laminar flow comprises a transport mechanism that moves the shield and its partitions from side to side relative to said eductors.

9. An electrolytic plating system for printed circuit boards comprising:
- a plating line supporting said printed circuit boards with a lower support rod;
- an upper rod that supports said lower rod;
- a vibrator on said upper rod; and
- a spring system to mount said upper rod to a rigid structure.

10. An electrolytic plating method for plating vias and thru-holes in printed circuit boards, comprising:
- positioning said printed circuit boards in an electrolytic bath; and
- alternately generating a laminar flow of electrolyte on each side of said printed circuit boards.

11. The electrolytic plating method of claim 10, wherein alternately generating a laminar flow of electrolyte further comprises:
- positioning a floating shield with a venturi-shaped partition and an aligned partition below said printed circuit boards; and
- operating a plurality of eductors below said floating shield.

12. The electrolytic plating method of claim 10, wherein alternately generating a laminar flow of electrolyte further comprises moving a transport mechanism so as to move the floating shield and its partitions from side to side relative to said eductors.

13. The electrolytic plating method of claim 12, further comprising supplying vibration energy to said printed circuit boards in said bath by mounting a vibrator on said transport mechanism using a spring-mounting system to prevent vibration energy being absorbed by fixed supports.

14. An electrolytic plating method for plating vias and thru-holes in printed circuit boards, comprising:
- providing an electrolyte bath;
- positioning a lower rod above said bath;
- providing electrical current to said lower rod with a flexible connection;
- clamping at least one printed circuit board to said lower rod;
- transporting said printed circuit boards in a floating shield with v-saddles in contact with said printed circuit boards, said floating shield further positioning a venturi-shaped partition below said printed circuit boards;
- producing a laminar flow of electrolyte across said printed circuit boards with at least one eductor positioned in a lower portion of said bath below said floating shield; and
- alternating said laminar flow from one side of said printed circuit board to an other side of said printed circuit board.

15. The electrolytic plating method of claim 14, further comprising:
- supporting said lower rod with an upper rod;
- supplying vibration energy to said upper rod; and
- isolating said vibration energy from a fixed structure with a spring system.

16. The electrolytic plating method of claim 14, further comprising providing a partition directly below said printed circuit boards to direct flow of electrolyte to either side of said printed circuit boards.

17. The electrolytic plating method of claim 16, wherein moving a transport mechanism moves the shield and its partitions from side to side relative to said eductors to alternate said laminar flow.

18. An electrolytic plating method for printed circuit boards comprising:
- supporting said printed circuit boards with a lower support rod of a plating line;
- supporting said lower rod with an upper rod;
- supplying vibration energy to said upper rod; and
- mounting said upper rod to a rigid structure with a spring system.

* * * * *